United States Patent
Ushida et al.

[11] 4,348,645
[45] Sep. 7, 1982

[54] BUFFER AMPLIFIER CIRCUIT USED IN WIDEBAND TUNER

[75] Inventors: Susumu Ushida; Hiroyuki Yanagida, both of Soma, Japan

[73] Assignee: Alps Electric Co., Ltd., Tokyo, Japan

[21] Appl. No.: 181,672

[22] Filed: Aug. 27, 1980

[30] Foreign Application Priority Data

Aug. 28, 1979 [JP] Japan .................. 54-118238[U]

[51] Int. Cl.[3] .................. H03F 3/191; H04N 5/50
[52] U.S. Cl. .................. 330/306; 358/196; 330/166
[58] Field of Search .......... 330/166, 167, 189, 196, 330/306; 358/188, 196

[56] References Cited

U.S. PATENT DOCUMENTS 2,603,723  7/1952  Thompson .................. 330/189
3,924,192  12/1975  George .................. 325/470

*Primary Examiner*—James B. Mullins
*Assistant Examiner*—Gene Wan
*Attorney, Agent, or Firm*—Guy W. Shoup; Gerard F. Dunne

[57] ABSTRACT

A buffer amplifier circuit of a wideband tuner has an output transistor. The output terminal of this transistor is grounded through a matching transformer having two taps. One of the taps constitutes a terminal through which the output signal is delivered to a mixer circuit, while the other tap is grounded through a capacitor which constitutes, in cooperation with the matching transformer, a trap circuit. This trap circuit is adapted to trap a frequency which is about twice as high as the low region oscillation frequency of a local oscillator which produces an input to the buffer amplifier circuit.

1 Claim, 1 Drawing Figure

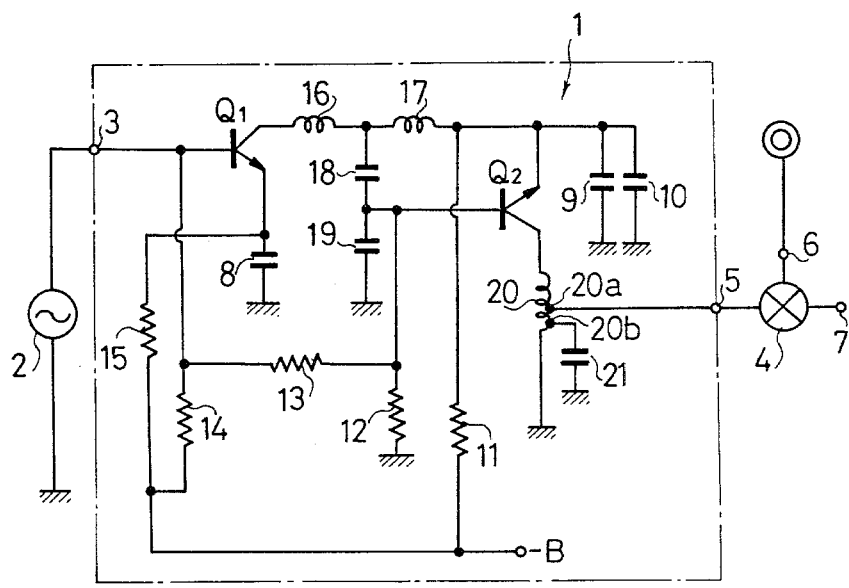

BUFFER AMPLIFIER CIRCUIT USED IN WIDEBAND TUNER

BACKGROUND OF THE INVENTION

The present invention relates to an improved buffer circuit for use in wideband tuners and, more particularly, to a buffer circuit suitable for use in CATV which receives more than 30 channels of television signals.

The buffer amplifier circuit in a wideband tuner is interposed between a local oscillator and a mixer, and is adapted to amplify the output signal from the local oscillator and to supply the amplified signal to the mixer in matching with the latter. The mixer receives the output signal from the buffer amplifier circuit, i.e. the amplified output from the local oscillator, and a high-frequency wave signal which is being received, and effects a frequency conversion of the high-frequency wave signal into an intermediate frequency signal (referred to as IF, hereinafter).

In the case of a CATV system, for instance, the frequencies of the received signals range between 54 MHz and 300 MHz. Assuming that the IF is to be 378 MHz, the oscillation frequency of the local oscillator is selected to be 432 MHz to 678 MHz.

In general, the local oscillator has a higher output level in the low oscillation frequency range. Therefore, it is often experienced that the output signal from the buffer smplifier is undesirably distorted when the latter receives an output signal from such a local oscillator. This distortion is transmitted from the buffer amplifier to the mixer, affecting adversely the frequency conversion conducted in the mixer.

SUMMARY OF THE INVENTION

It is, therefore, an object of the invention to provide a butter amplifier circuit capable of transmitting the desired signal to the mixer irrespective of the oscillation level of the local oscillator.

It is another object of the invention to provide a buffer amplifier circuit provided with a trap circuit.

It is a further object of the invention to provide a buffer amplifier circuit having a simple construction and a low cost.

These and other objects, as well as advantageous features of the invention will become clear from the following description of the preferred embodiment taken in conjunction with the accompanying drawing.

BRIEF DESCRIPTION OF THE DRAWINGS

The sole FIGURE attached hereto is a schematic diagram of a buffer amplifier circuit embodying the present invention.

DESCRIPTION OF THE PREFERRED EMBODIMENT

Referring to the drawing, a buffer amplifier circuit 1 has an input terminal 3 for receiving the output from a wideband local oscillator 2, and an output terminal 5 for delivering its output signal to a mixer 4. The mixer 4 has a terminal 6 for receiving a high-frequency signal and an output terminal 7 for delivering the intermediate frequency (referred to as IF, hereinunder).

In the case of a CATV system, for example, the frequency of the high-frequency signal appearing at terminal 6 ranges between 54 MHz and 300 MHz. On the other hand, the local oscillator 2 oscillates over the frequency range of between 432 MHz and 678 MHz. The frequency of IF is 378 MHz.

The buffer amplifier circuit 1 includes two transistors $Q_1$ and $Q_2$. The emitter electrodes of the transistor $Q_1$ and $Q_2$ are grounded through bypass capacitors 8, 9 and 10 for grounding the emitters of these transistors. Resistors 11, 12, 13, 14 and 15 are for suitably biasing the transistors $Q_1$ and $Q_2$. A series circuit constituted by a coil 16 and another coil 17 is connected to the collector electrode of the transistor $Q_1$. The end of the coil 17 is connected to the emitter electrode of the transistor $Q_2$ as well as $-B$ power source. The junction point between the coils 16 and 17 is grounded through a series circuit constituted by capacitors 18 and 19. The junction point between these capacitors 18 and 19 is connected to the base electrode of the transistor $Q_2$ and is grounded through a biasing resistor 12. The coils 16, 17 and the capacitors 18, 19 in combination constitute a band-pass filter which passes signals having a frequency range in the oscillation range of the local oscillator 2, i.e. signals having frequencies ranging between 432 MHz and 678 MHz.

The collector electrode of the transistor $Q_2$ is grounded through a matching transformer 20 having two taps 20a and 20b. The matching transformer 20 is adapted to make a tap-down operation while having resonance oscillation with an output capacitance and produces a local oscillation signal to be delivered to the mixer 4 at its second tap 20a. The first tap 20b is grounded through a capacitor 21 which forms with the tapped portion of the transformer a trap circuit adapted to have resonance oscillation. The frequency of this trap circuit is selected to be twice as large as the low range oscillation frequency of the local oscillator which, typically, is 440 MHz, i.e. at 880 MHz.

As is well known, the mixer is adapted to make a frequency conversion of $IF = f_L - f_{o1}$ for converting the recieved frequency $f_{o1}$ into desired IF.

On the other hand, in wideband tuners, a multiplicity of received frequencies exist simultaneously. Representing these frequencies by symbols $f_{o2}$, $f_{o3}$, the mixer produces simultaneously the intermediate frequencies $IF_{o2} = f_L - f_{o2}$ and $IF_{o3} = f_L - f_{o3}$. Usually, the circuit connected to the output side of the mixer, e.g. IF amplifier, is provided with an IF filter adapted to pass only the desired IF signal, so that only the desired IF is passed to the next stage. However, if the levels of the above-mentioned $IF_{o2}$ and $IF_{o3}$ are high, these IFs may be transmitted from the input terminal 6 to cause interference on other receivers. This interference depends usually on the oscillation level of the local oscillator 2 in the case of wideband tuners. Namely, the local oscillator has such a tendency that, due to the frequency characteristics of the transistors incorporated therein, the oscillation level is high at the low oscillation frequency range and low at the high oscillation frequency range. In case of the local oscillator incorporated in the circuit of the invention, the oscillation level is specifically high in the region around 440 MHz.

The output from the buffer circuit 1 often involves a distortion when the buffer circuit receives a signal from a local oscillator of high oscillation level. This distortion contains a component of a frequency which is twice as high as the frequency of the low region of the local oscillator, i.e. a component of 880 MHz. This signal of frequency twice as high as the low region frequency affects the aforementioned interference.

The mixer 4 produces an output signal which is the frequency difference between the output signal from the local oscillator and the input high-frequency signal, in the frequency conversion, as well as a signal which is the sum of both signals. Representing the input high-frequency signals by $f_{o2}$ and $f_{o3}$ as in the former case, the mixer 4 produces frequency signals of $f_{o2}+f_L$ and $f_{o3}+f_L$, simultaneously.

Therefore, when a frequency $2f_L$ which is twice as high as the output frequency $f_L$ of the local oscillator is produced due to distortion in the buffer amplifier, the mixer 4 produces signals of frequencies represented by the following equations:

$$2f_L - (f_{o2}+f_L) = f_L - f_{o2}$$

and $$2f_L - (f_{o3}+f_L) = f_L - f_{o3}$$

These frequencies are added to the aforementioned interfreence signal to make the interference greater.

However, according to the invention, the frequency $2f_L$ is never transmitted to the mixer 4 because the capacitor 21 is connected to a tap on the transformer 20 at the output end of the output transistor of the buffer circuit 1, to trap the frequency $2f_L$. The enhancement of the converted input signal appearing at the input terminal from the mixer 4, therefore, does not take place.

For information, the values of elements incorporated in practical embodiments of the present invention are as follows:

8 ... 1423 pF
9 ... 1442 pF
10 ... 948 pF
11 ... 620Ω
12 ... 3.84 KΩ
13 ... 2.64 KΩ
14 ... 1.44 KΩ
15 ... 390Ω
21 ... 7 pF
$Q_1$ ... SPS 5429
$Q_2$ ... 2SC 2407.

What is claimed is:
1. A buffer amplifier circuit adapted to receive the output from a local oscillator and to amplify and deliver said output signal to a mixer, said buffer amplifier comprising:
an input terminal for receiving said output signal from said local oscillator;
an amplification means for amplifying said output signal;
an output transistor for delivering a signal to said mixer, said output transistor having an output electrode grounded through a matching transformer having first and second taps;
a capacitor connected between said first tap and the ground, said capacitor constituting in combination with said matching transformer a trap circuit adapted to have resonance oscillation at a frequency of an order twice as high as the low region oscillation frequency of said local oscillator; and
an output terminal connected to said second tap and adapted to deliver the amplified local oscillation signal to said mixer.

* * * * *